United States Patent [19]
Sprague

[11] Patent Number: 5,828,234
[45] Date of Patent: Oct. 27, 1998

[54] PULSED RESET SINGLE PHASE DOMINO LOGIC

[75] Inventor: Milo David Sprague, Aloha, Oreg.

[73] Assignee: Intel Corporation, Santa Clara, Calif.

[21] Appl. No.: 702,244

[22] Filed: Aug. 27, 1996

[51] Int. Cl.⁶ .............................. H03K 19/096
[52] U.S. Cl. .................. 326/98; 326/17; 326/97
[58] Field of Search ............... 326/95, 98, 93, 326/96–97, 112, 119, 121, 17; 327/227, 230, 288

[56] References Cited

U.S. PATENT DOCUMENTS

| | | | |
|---|---|---|---|
| 4,700,088 | 10/1987 | Tubbs | 326/17 |
| 5,402,012 | 3/1995 | Thomas | 326/97 |
| 5,440,243 | 8/1995 | Lyon | 326/98 |
| 5,565,798 | 10/1996 | Durham et al. | 326/17 |

*Primary Examiner*—Jon Santamauro
*Attorney, Agent, or Firm*—Blakely, Sokoloff, Taylor & Zafman

[57] ABSTRACT

The pulsed reset single phase dynamic logic of the present invention reorders the conventional modes of operation such that in a single cycle of operation of a domino logic circuit, reset occurs first, followed sequentially by gap2, evaluation and gap1. To reset each domino stage prior to evaluating, a reset pulse is propagated to each domino stage, with an evaluate signal arriving at each stage as the reset pulse is ending. The circuit configuration of the present invention creates a different, but shorter and easier to manage set of race conditions. The present invention permits the creation of faster and more robust circuit designs.

10 Claims, 11 Drawing Sheets

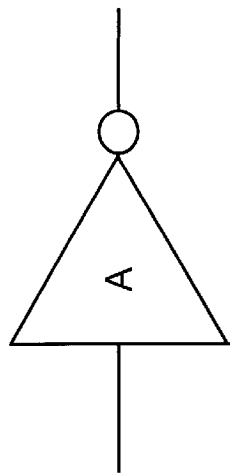
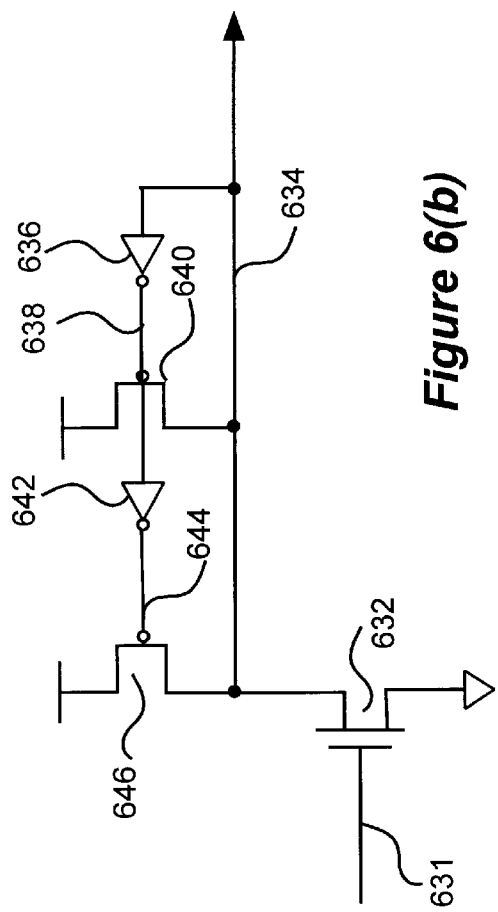
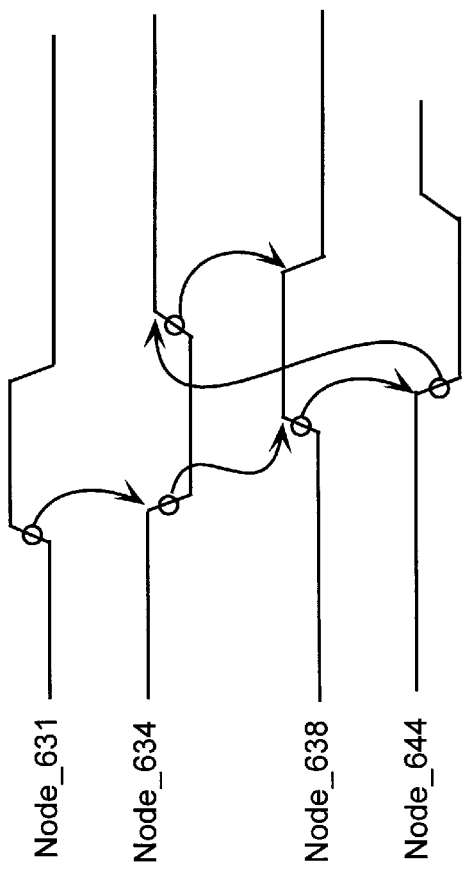

5,828,234

PULSED RESET SINGLE PHASE DOMINO LOGIC

BACKGROUND OF THE INVENTION

1. Field of the Invention

The present invention relates to high speed domino logic design, and more particularly to overcoming speed constraints imposed by race conditions in single phase domino logic.

2. Background

Advances in semiconductor manufacturing technologies have allowed circuit designers to integrate tremendous numbers of transistors on a single die. For example, modern integrated circuits (ICs) commonly include several million transistors interconnected on a single, small substrate. Typically these are field effect transistors (FET). At the same time, computer architecture, and more particularly processor architecture, has gone in the direction of emphasizing shorter and shorter cycle times. These advances in semiconductor manufacturing and processor architecture have led designers to consider new ways of implementing basic circuit functions.

Producing IC's with shorter cycle times, means increasing the clock frequency at which these devices operate. Increasing clock frequencies means that fewer logic gate delays are permitted within each clock cycle. As described below, several styles of logic design have been developed to achieve high speed operation.

Static full CMOS logic requires one p-channel field effect transistor (PFET) for each n-channel field effect transistor (NFET). For complex logic gates this means either an NFET stack with a PFET OR structure, or an NFET OR structure with a PFET stack. FIG. 1 (a) shows the transistor level configuration of a static full CMOS complex logic gate. FIG. 1 (b) shows a logic symbol representing the logical function implemented by the circuit of FIG. 1 (a).

The physical layout of these complex logic gate structures produces a substantial amount junction area, and thus parasitic capacitance, associated with the output node.

Reduced power, chip area and output capacitance can be obtained through the use of domino logic circuits. Domino logic reduces the layout and parasitic capacitance problems associated with static full CMOS complex logic gates. As will be understood by those skilled in the art, a reduction in parasitic capacitance permits higher speed and lower power operation. As compared to static circuits, domino circuits typically have a higher power density because they have more clock loading, and a higher activity factor per node. Further comparing static and domino circuits, domino logic circuits typically are more noise sensitive. FIGS. 2–4 illustrate basic domino logic stages. FIG. 5 illustrates a domino logic chain.

FIG. 2 shows a conventional implementation of a 2-input NAND gate 210 in domino logic. NAND gate 210 comprises NFETs 211–213 coupled in series (i.e., an n-stack) between an output node 218 and ground, and a PFET 214 coupled between a power and output node 218. The gate of PFET 214 is coupled to the gate of NFET 211 and both gates receive input clock signal CLK. Data inputs B and A are shown coupled to the gates of NFETs 212 and 213 respectively. In operation, there are two phases, a precharge phase and an evaluate phase. Alternative terms for these two phases are the precharge period and the evaluation period, respectively. In the precharge phase, output node 218 charges to a high level when CLK is low because NFET 211 is off, thus there is no conduction path to ground from output node 218 and at the same time PFET 214 is on, thus creating a conduction path from power supply Vcc to output node 218. For proper operation, signals A and B are expected to become stable prior to CLK going high. In the evaluate phase, CLK goes high thus turning off PFET 214 and turning on NFET 211. With NFET 211 turned on, there will be a conduction path from output node 218 to ground if both signals A and B are high. That is, if both NAND inputs are high, the output will go low during the evaluate phase, otherwise the output will remain high. Note that when output node 218 is not discharged through the n-stack during the evaluate phase, that output node 218 is "floating" high and its voltage will be subject to change due charge loss or gain though leakage currents and capacitive coupling to other signals.

FIG. 3 shows an implementation of a 2-input NAND gate 310 in domino logic including a half keeper. The half keeper overcomes the problem described above in connection with NAND gate 210 of FIG. 2, where the output node is subject to charge loss/gain while it is floating. This permits the clock frequency to be reduced and even permits the clock to be stopped while maintaining a high level at the output node of the domino logic stage. NAND gate 310 comprises NFETs 311–313 coupled in series between an output node 318 and ground, and a pair of PFETs 314–315 coupled in parallel between a power supply Vcc and output node 318. The gate of PFET 314 is coupled to the gate of NFET 311 and both receive input clock signal CLK. Data inputs B and A are shown coupled to the gates of NFETs 312 and 313 respectively. An inverter 317, in conjunction with PFET 315, implements the half-keeper function. Inverter 317 has its input coupled to output node 318 and its output coupled to the gate of PFET 315. In operation, when clock signal CLK rises PFET 314 turns off, but if either of inputs A or B remain low, output node 318 remains high, with PFET 315 providing the current necessary to overcome any leakage or capacitively coupled noise.

FIG. 4 shows an implementation of a 2-input NAND gate 410 in domino logic including a full keeper. Whereas the half keeper of NAND gate 310 of FIG. 3, maintains a high level at the output node of the domino logic stage, a full keeper operates to maintain, or reinforce, a high level or a low level. NAND gate 410 comprises NFETs 421–423 coupled in series between an output node 427 and ground, and a PFET 424 coupled between a power supply Vcc and output node 427. The gate of PFET 424 is coupled to the gate of NFET 421 and both receive input clock signal CLK. Data inputs B and A are shown coupled to the gates of NFETs 422 and 423 respectively. A cross-coupled pair of inverters 425 and 426 forms the full keeper. Inverter 426 has its output coupled to the input of inverter 425, and its input coupled to output node 427. Inverter 425 has its output coupled to output node 427.

As can be seen in FIG. 5, conventional domino circuits used with two-phase clocking, have clock ANDed NFET blocks configured to precharge in one s clock phase, and to evaluate in the subsequent clock phase. An inverter typically separates the domino stages so that during precharge, the inputs to the next stage are forced low. During the evaluate phase the precharged node may transition to a low and the signal will ripple like dominos falling down through the logic. This permits the inputs to each block to come from a latch or a preceding stage of domino logic. A half keeper is typically used to hold a high level at the precharged output node of the domino logic stages.

Still referring to FIG. 5, the inputs to the domino are latched when the evaluate phase begins and open during the precharge phase. The data is setup by the end of the precharge phase before the next clock edge.

Various advanced forms of domino logic have been developed to increase the speed of operation. Single-phase pulsed domino is one form of domino logic useful for high speed operation. Single-phase pulsed domino logic can be implemented in both self-resetting and globally resetting forms. This style of logic design is susceptible to functional errors due to race conditions and therefore requires careful management of race conditions during the design process.

For very high speed designs, single phase pulsed clock domino logic can be used in place of two phase domino logic. One of the problems with this type of design is that many of the conditions which were frequency dependent in two phase domino become self-timed race conditions and must be designed with additional margin to insure functionality.

In domino logic schemes, whether single phase or two phase, the operation of a domino gate within a clock cycle can be divided into four modes. These modes are evaluation, gap1, reset, and gap2. Evaluation refers to the period of time that the evaluate stack is turned on. Gap1 refers to the period of time between the evaluate stack being turned off and the reset device being turned on. Reset refers to the period of time that the reset device is turned on. Gap2 refers to the period of time between the reset device being turned off and the evaluate stack being turned on.

What is needed is a high speed domino logic circuit configuration that is tolerant of clock jitter, allows time-borrowing, and provides inherent race margin to ease the design of these circuits and to increase their operational reliability at the same time.

SUMMARY OF THE INVENTION

The pulsed reset single phase domino logic of the present invention reorders the conventional modes of operation such that in a single cycle of operation, a domino logic circuit reset occurs first, followed sequentially by gap2, evaluation and gap1. To reset each domino stage prior to evaluating, a reset pulse is propagated to each domino stage, with an evaluate arriving at each stage as the reset pulse is ending. The circuit configuration of the present invention creates a different, but shorter and easier to manage set of race conditions. The present invention permits the creation of faster and more robust circuit designs.

BRIEF DESCRIPTION OF THE DRAWINGS

FIG. 6(b) is a schematic diagram of an atomically resetting inverter.

FIG. 6(c) shows a logic symbol used to represent the atomically resetting inverter of FIG. 6(b).

FIG. 6(d) is a timing diagram illustrating the operation of the atomically resetting inverter of FIG. 6(b).

DETAILED DESCRIPTION OF THE INVENTION

The detailed circuit configuration of two embodiments of the present invention are described below in the section labelled "Circuit Configuration". The operation of the present invention is described below in the section labelled "Circuit Operation".

Terminology

Race condition refers to the operation of a circuit in which the result is dependent on the amount of delay, as measured from a common triggering event, such as a clock edge, experienced by signals as they propagate through the circuit.

Functional race refers to a race condition in which a circuit fails to operate as intended outside a given range of delays.

Power race refers to a condition in which a circuit operates as intended, however power consumption increases outside a given range of delays.

Delay unit refers to a time period substantially equal to one inverter delay. This time period may also be referred to as a unit delay.

Terminal refers to a connection point. Typically, outputs, or output terminals, are coupled to inputs, or input terminals, to propagate signals.

Figure 1A:
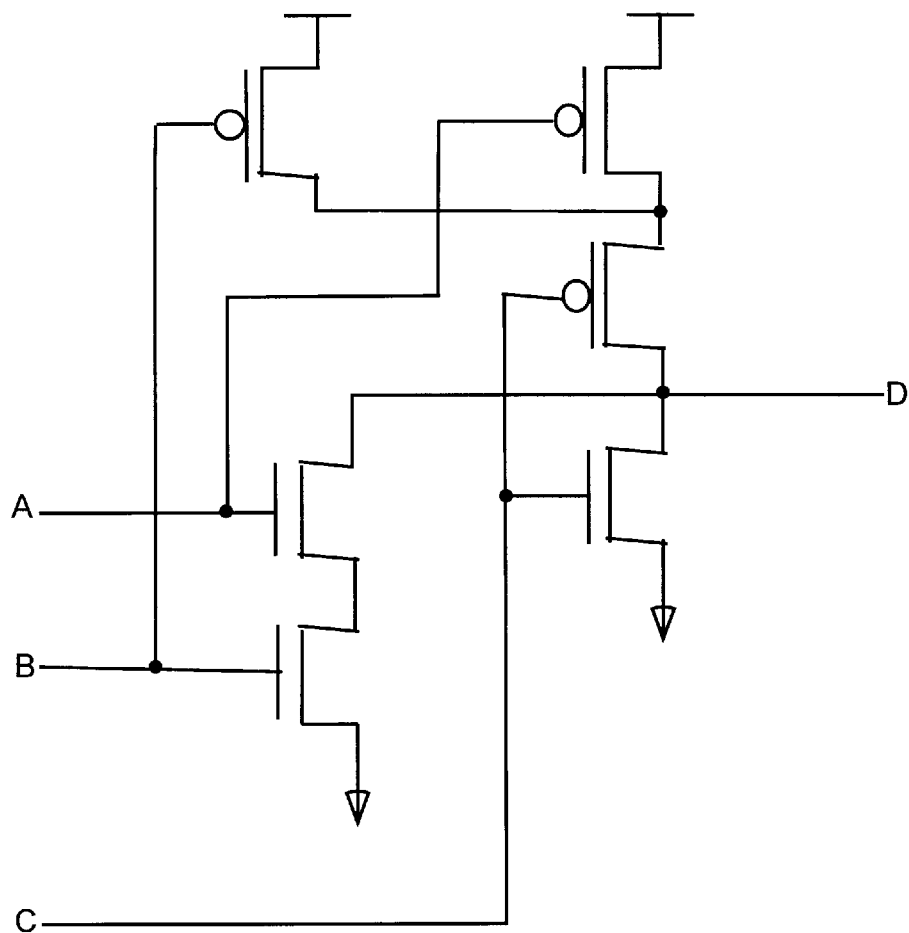
FIG. 1(a) shows the transistor level configuration of a static full CMOS complex logic gate.
Figure 1B:
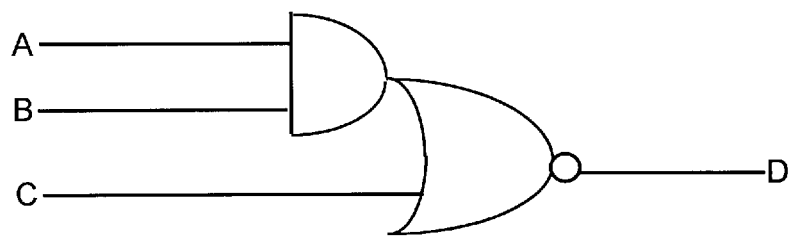
FIG. 1(b) shows a logic symbol representing the logical function implemented by the circuit of FIG. 1(a).
Figure 2:
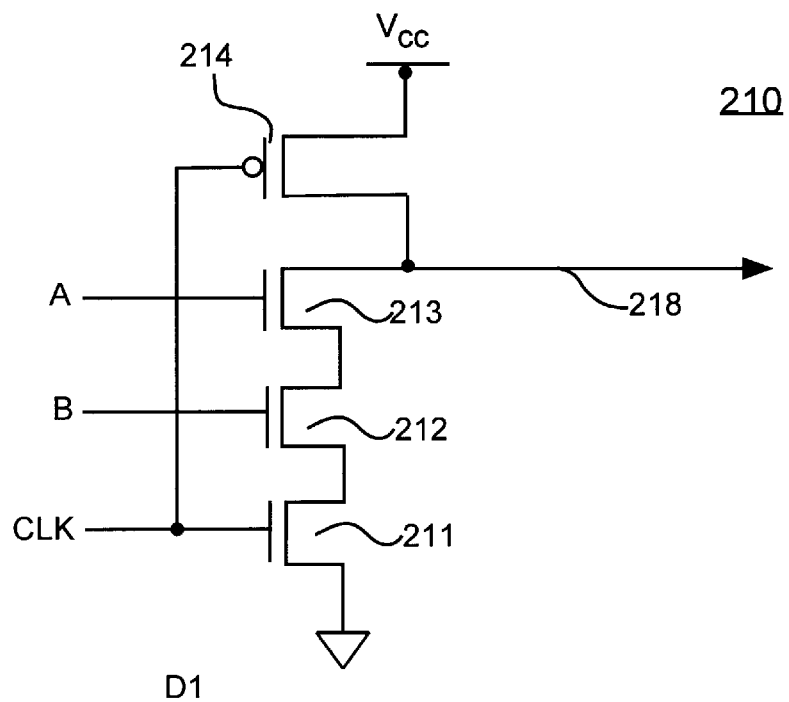
FIG. 2 shows the circuit configuration of a basic domino logic stage.
Figure 3:
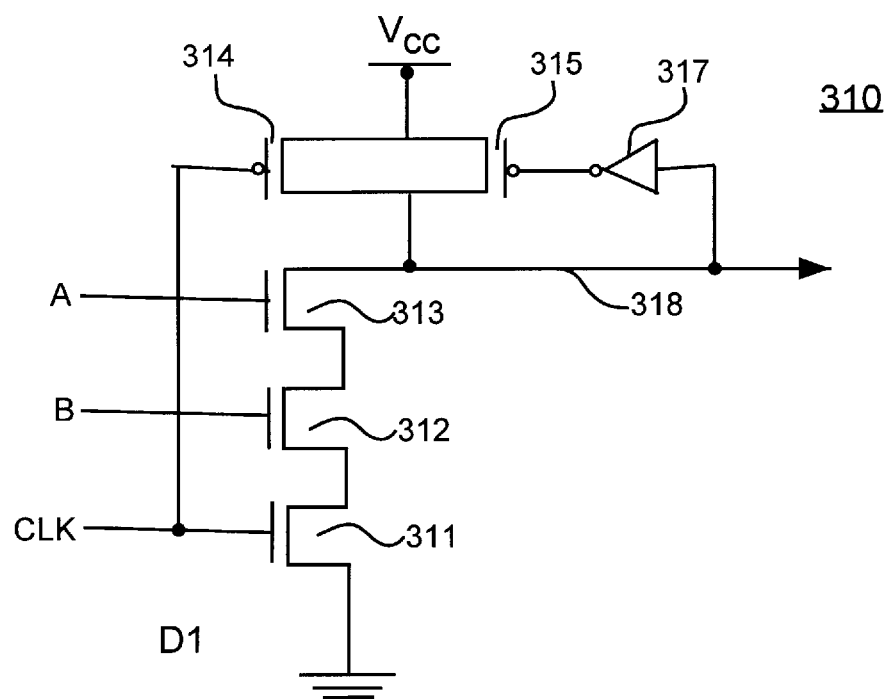
FIG. 3 shows the circuit configuration of a domino logic stage having a half keeper.
Figure 4:
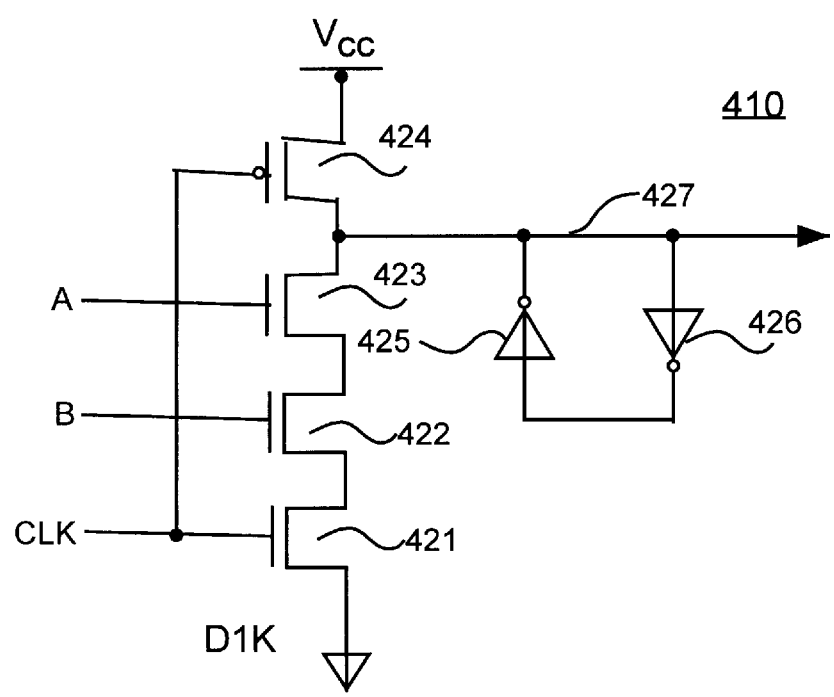
FIG. 4 shows the circuit configuration of a domino logic stage having a full keeper.
Figure 5:
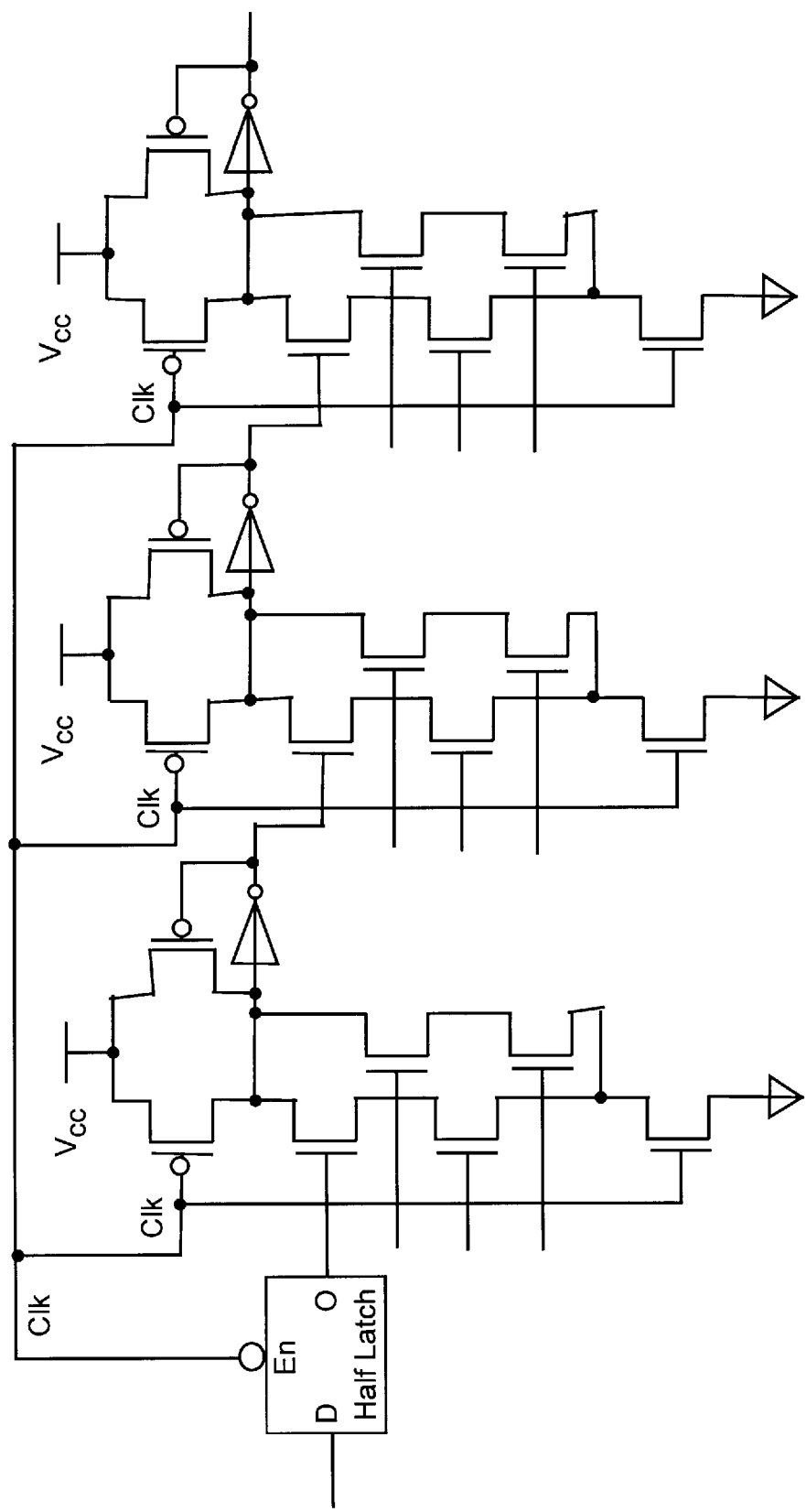
FIG. 5 shows a two phase domino logic chain.

Keeper refers to a circuit added to a dynamic node to maintain that node at a predetermined voltage level. Typically, a keeper is added to a node that, in operation, will periodically be precharged high. The keeper supplies the charge necessary to compensate for the loss of charge due to various leakage paths, as well as loss of charge due to capacitive coupling of the node to other signal paths. A half-keeper is a circuit providing a switchable, direct, conductive pathway between the dynamic node and one voltage source, e.g., a positive voltage source, and therefore operable only to maintain the dynamic node at one level, e.g., a high level. A half-keeper circuit can be seen in FIG. 3. A full-keeper is a circuit providing a switchable, direct, conductive pathway between the dynamic node and two voltage sources, e.g., a positive voltage and ground, and therefore operable to maintain the dynamic node at either a high or low level. A full-keeper circuit can be seen in FIG. 4.

In the field of digital circuit technology generally, reset refers to bringing an output node to a logical low, or zero. However, with respect to a domino logic stage, reset refers to bringing an output node to the "non-evaluate" state. That is, a domino stage having an n-channel evaluate path will reset to a high level, but a domino stage having a p-channel evaluate path will reset to a low level.

Zipper domino refers to a circuit configuration having a plurality of domino stages connected in series, where the domino stages are alternately n-channel evaluate path stages, and p-channel evaluate path stages.

Jam latch refers to a circuit in which a pair of cross-coupled inverters has one of its two nodes electrically coupled to the output of a logic gate. The jam latch is also referred to as a full keeper.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor substrate is considered, for the purpose of describing the circuit configuration of the present invention, the FET will be described using the traditional gate-drain-source, three terminal model.

Time borrowing, in the context of series connected, domino logic pipestages, refers to a process in which late arriving data is allowed to propagate through a latch boundary.

Self-resetting circuits are also sometimes referred to as having atomic reset circuits.

Circuit Configuration

Figure 6A:
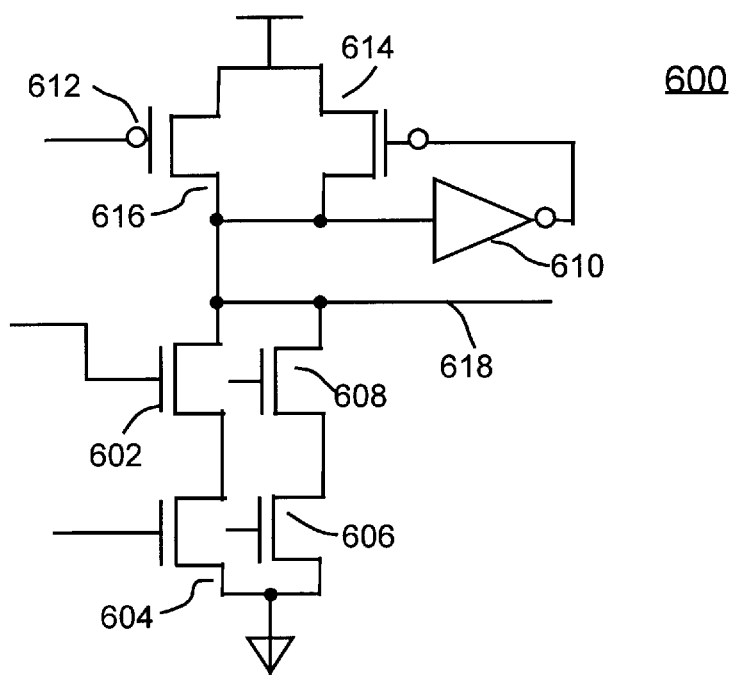
FIG. 6(a) shows the circuit configuration of domino logic stage having domino compatible inputs, a half-keeper, and a reset device.

FIG. 6(a) illustrates a domino logic stage 600 used to form the pipestage of the present invention. As will be understood by those skilled in the art, various logic functions can be implemented by variously configuring the NFETs coupled between domino output 618 and ground. In the example illustrated in FIG. 6(a), two parallel, two high AND stacks are used. A first AND stack is made by coupling NFETs 602, 604 in series between domino output 618 and ground as shown in FIG. 6(a). A second AND stack is made by coupling NFETs 606, 608 in series between domino output 618 and ground as shown in FIG. 6(a). Two PFETs 614, 616, are coupled in parallel between a power supply and domino output 618. PFET 616 is the reset device, and provides the charge needed to return domino output 618 from a low level to a high level. PFET 616 has a gate 612 which is coupled to a pulsed reset signal. The half keeper function of domino logic stage 600 includes an inverter 610. The input of inverter 610 is coupled to domino output 618. The output of inverter 610 is coupled to the gate of PFET 614. Inverter 610 together with PFET 614 implement the half keeper function.

When domino output 618 is high, the output of inverter 610 goes low, and the low on the gate of PFET 614 turns on PFET 614 so that a conductive path between the power supply and domino output 618 exists. In this way, a high level is maintained at domino output 618 by the half-keeper. When domino output 618 evaluates low, the output of inverter 610 goes high, and consequently PFET 614 turns off.

When gate 612 of PFET 616 is at a high level, PFET 616 is turned off and no conductive path exists, through PFET 616, between the power supply and domino output 618. When gate 612 of PFET 616 is at a low level, PFET 616 is turned on and a conductive path exists between the power supply and domino output 618. In this way, domino output 618 is reset to a high level. As domino output 618 returns to a high level, the output of inverter 610 goes low, consequently PFET 614 turns off. Typically PFETs 614, 616, are sized such that PFET 614 has a greater on-resistance than PFET 616.

FIG. 6(b) illustrates an atomically resetting inverter (also known as a self-resetting inverter) 630 used to form the reset timing control circuitry and the evaluate clock circuitry of the present invention. As shown in FIG. 6(b), an input signal 631 is coupled to the gate of NFET 632. NFET 632 is coupled between an output node 634 and ground. Output node 634 is coupled to the input of a first inverter 636, which has an output 638. Output 638 of first inverter 636 is coupled to the gate of a PFET 640, and further coupled to the input of a second inverter 642. Second inverter 642 has an output 644 which is coupled to the gate of a PFET 646. FIG. 6(c) shows the symbol used to represent the circuit of FIG. 6(b). The operation of atomically resetting inverter 630 is shown clearly in the timing diagram of FIG. 6(d).

Figure 7A:
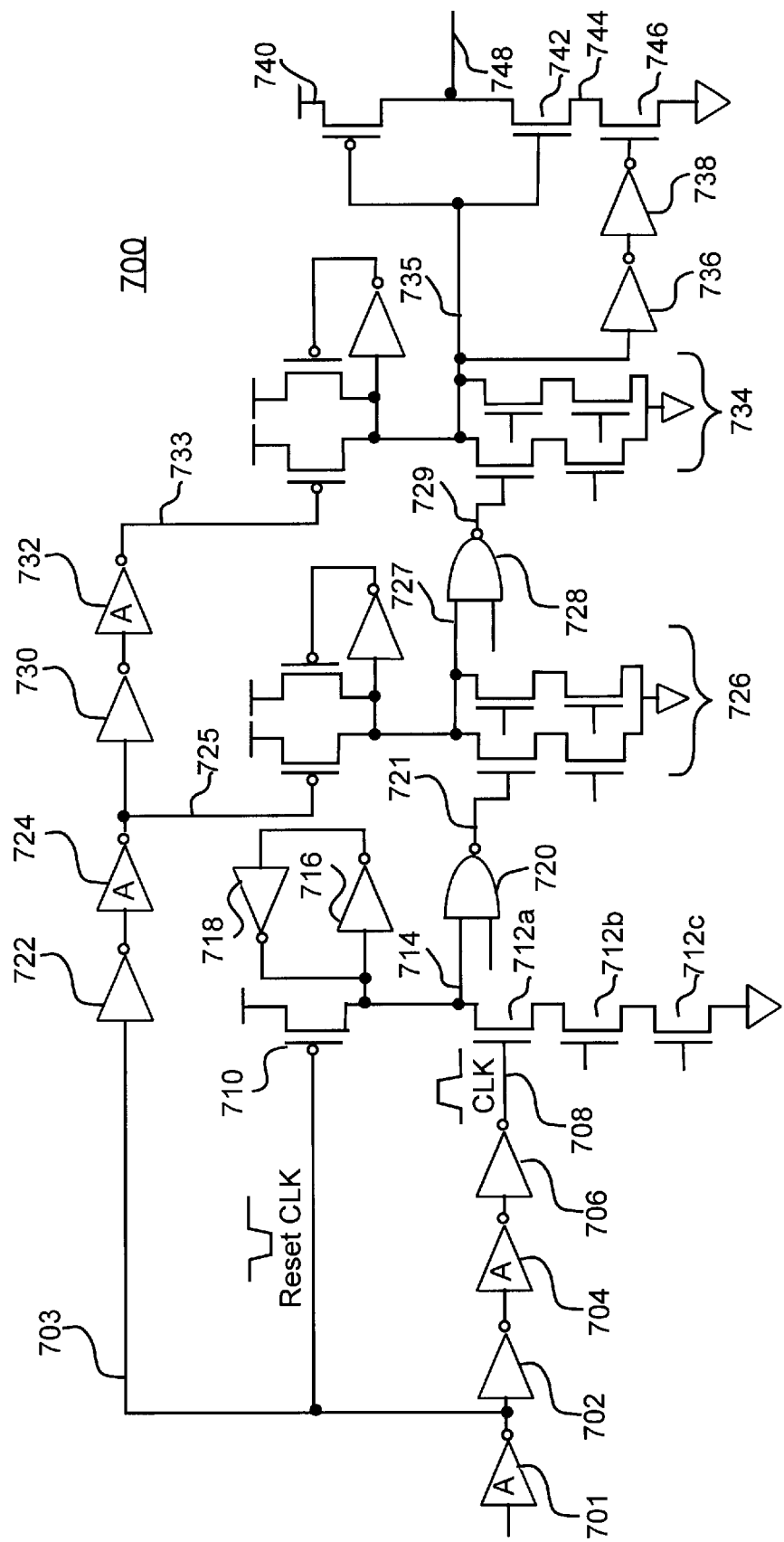
FIG. 7(a) is a schematic diagram showing a domino pipestage embodying the pulsed reset timing control mechanism of the present invention.

Referring to the illustrative example of FIG. 7(a), a pipestage 700 embodying a reset timing control circuit in accordance with the present invention is described. The reset timing control circuit has one reset pulse delay circuit for each domino stage in the pipestage except for the first domino stage of the pipestage. The first domino stage of the pipestage receives an undelayed version of the reset pulse.

The logic functions shown for the domino stages and static logic stages in FIG. 7(a) are for illustrative purposes, and those skilled in the art will recognize that any logic function can be selected for each of the six stages. The illustrative embodiment shows the relationship between the signal paths of the reset pulse and evaluate signals that are received by the domino stages that do not generate a local, or self reset signal. Typically, to provide a reset pulse before an evaluate input signal to a domino stage in a given single cycle, the reset signal path will be shorter than the evaluate input signal path.

An atomically resetting inverter 701 produces as an output a pulsed reset signal 703 which is coupled to the input of an evaluate clock delay circuit, the input of a first reset pulse delay circuit, and the gate of PFET 710, which is the reset device of the first domino logic stage in pipestage 700. In the illustrative embodiment, the evaluate clock circuit is implemented by the series interconnection of inverter 702, atomically resetting inverter 704, and inverter 708; and the first reset timing control circuit is implemented by the series interconnection of inverter 722, and atomically resetting inverter 724. Alternatively, an evaluate clock circuit may be referred to as an evaluate signal generator, especially when the evaluate signal is not just a timing signal but has been combined with some logical qualifiers. Atomically resetting inverter 724 has an output 725 which is coupled to a second reset pulse delay circuit. The second reset timing control circuit shown in the illustrative embodiment of the present invention in FIG. 7(a) is implemented by the series interconnection of an inverter 730 and an atomically resetting inverter 732. Atomically resetting inverter 732 has an output 733. Each inverting logic gate and each atomically resetting inverting logic gate introduces approximately one delay to the leading edge of the input signals.

The first domino logic stage is an NFET-evaluate-stack domino stage (alternatively referred to as an n-stack domino stage) and has an output node 714. NFETs 712a, 712b, and 712c are coupled in series between output node 714 and ground. PFET 710 is coupled between a power supply and output node 714. Output node 714 is coupled to logic gate 720. A jam latch made up of cross-coupled inverters 716 and 718 is coupled to output node 714.

A second domino logic stage 726 has an output node 727. Domino logic stage 726 is an n-stack domino stage and has the same circuit configuration as domino logic stage 600 shown and described in connection with FIG. 6(a). The gate of the reset device of domino logic stage 726 is coupled to output 725. Output 727 of domino stage 726 is coupled to an inverting logic gate 728. Inverting logic gate 728 has an output 729.

A third domino logic stage 734 has an output node 735. Domino logic stage 734 is an n-stack domino stage and has the same circuit configuration as domino logic stage 600 shown and described in connection with FIG. 6(a). The gate of the reset device of domino logic stage 734 is coupled to output 733.

A pulse extender is used to provide increased hold time at the final output 748 of pipestage 700. In the illustrative embodiment shown in FIG. 7(a), the pulse extender is implemented with two inverters, two NFETs and a PFET. More particularly, output 735 of third domino stage 734 is coupled to: the gate of a PFET 740, the gate of an NFET 742, and the input of an inverter 736. PFET 740 is coupled between a power supply and output 748. NFET 742 is coupled between output 748 and intermediate node 744. An NFET 746 is coupled between intermediate node 744 and ground. An inverter 738 is coupled in series between the output of inverter 736 and the gate of NFET 746.

In this illustrative embodiment of the present invention, circuit pairs are formed wherein an NFET evaluate path domino stage is coupled to an inverting logic gate. Similarly, such circuit pairs may also be formed wherein an NFET evaluate path domino stage is coupled to a PFET evaluate path domino stage. It will be recognized by those skilled in the art that a circuit pair may also include a domino stage coupled to a pulse extender.

In this illustrative embodiment of the present invention, inverting logic gates 720 and 728 are shown to be two-input NAND gates. Those skilled in the art will understand that inverting logic gates 720 and 728 may be any inverting, logic gates. Those skilled in the art will also understand that the NFET evaluate stacks shown in the illustrative example of FIG. 7(a) may be configured to implement combinatorial logic functions other than those shown.

Figure 7B:
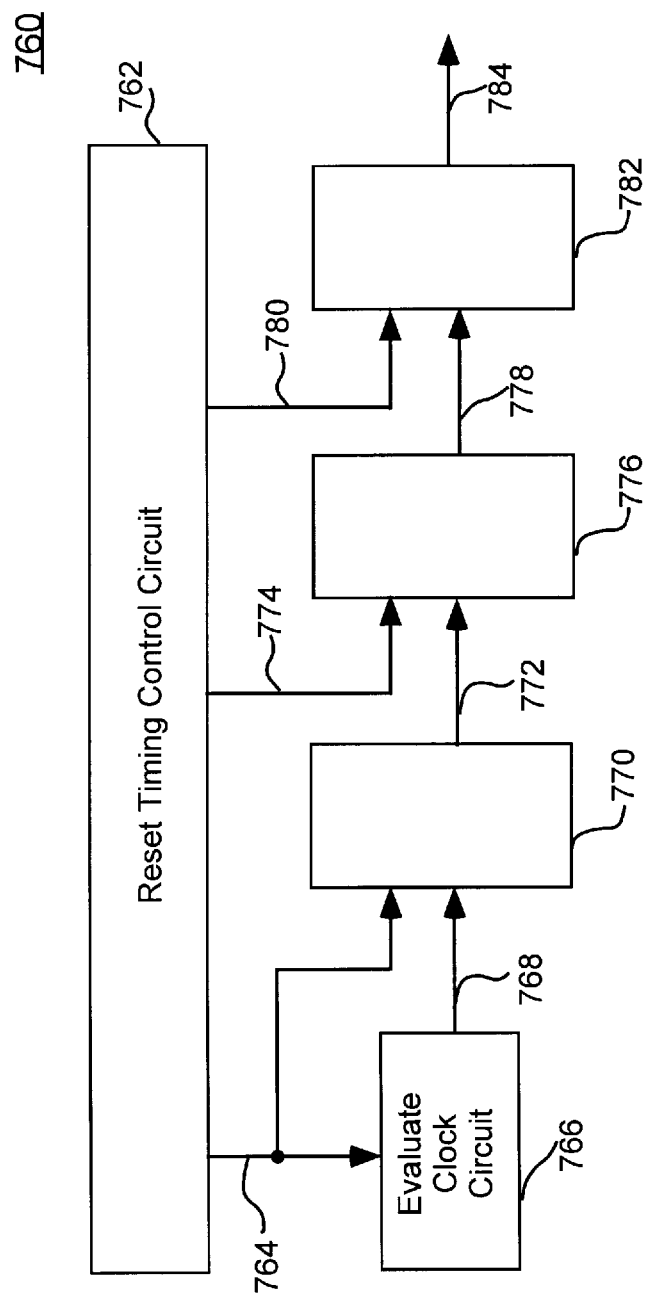
FIG. 7(b) is a high level block diagram showing the relationship of the various circuit blocks used to implement an illustrative embodiment of the present invention.

Referring to FIG. 7(b), the relationship of the various circuit blocks used to implement an illustrative embodiment of the present invention is described. A pipestage 760 has a reset timing control circuit 762 with outputs 764, 774, and 780; an evaluate clock circuit 766 with output 768; circuit pairs 770, 776, and 782. Circuit pair 770 has an output 772, and receives as an input, output 764 of reset timing control circuit 762, and further receives output 768 of evaluate clock circuit 766. Circuit pair 776 has an output 778, and receives as an input, output 774 of reset timing control circuit 762, and further receives output 772 of circuit pair 770. Circuit pair 782 has an output 784, and receives as an input, output 780 of reset timing control circuit 762, and further receives output 778 of circuit pair 776. The last circuit pair in the pipestage is preferably implemented with its inverting logic gate configured as a pulse extender to provide increased hold time at the output.

Figure 8:
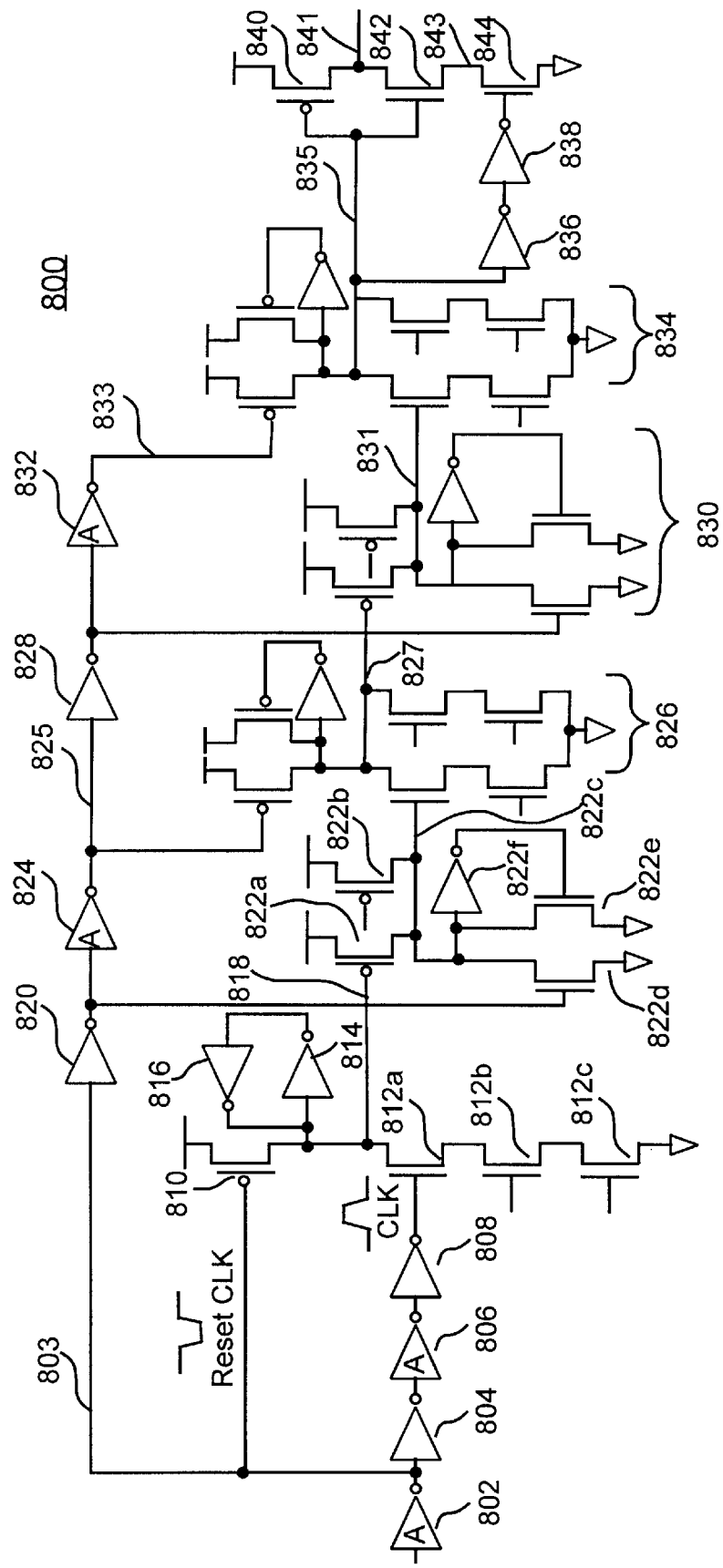
FIG. 8 is a schematic diagram of an alternative domino pipestage design which also embodies the pulsed reset timing control mechanism of the present invention.

Referring to the illustrative example of FIG. 8, a pipestage 800 embodying the reset timing control mechanism of the present invention is described. The logic functions shown for the domino stages in FIG. 8 are for illustrative purposes, and those skilled in the art will recognize that any logic function can be selected for each of the six stages.

A pulsed reset signal 803 is coupled to the input of an evaluate clock delay circuit, the input of a first reset pulse delay circuit, and the gate of PFET 810, which is the reset device of the first domino logic stage in pipestage 800. In the illustrative embodiment, the evaluate clock circuit is implemented by the series interconnection of inverter 804, atomically resetting inverter 806, and inverter 808; and the first reset timing control circuit is implemented by an inverter 820. Second reset pulse delay circuit is implemented by an atomically resetting inverter 824 having an output 825.

The first domino logic stage is an NFET-evaluate-stack domino stage (alternatively referred to as an n-stack domino stage) and has an output node 818. NFETs 812a, 812b, and 812c are coupled in series between output node 818 and ground. PFET 810 is coupled between a power supply and output node 818. A jam latch made up of cross-coupled inverters 814 and 816 is coupled to output node 818. Output node 818 is coupled to a first inverting logic stage, implemented in the illustrative embodiment of FIG. 8 as a first PFET-evaluate domino stage.

The first PFET-evaluate domino stage of FIG. 8 has PFETs 822a, 822b each coupled between the power supply and an output node 822c. The gate of PFET 822a is coupled to output 818 of the first domino stage. The first PFET-evaluate domino stage has NFETs 822d, 822e coupled between output node 822c and ground. An inverter 822f coupled so as to receive its input from the output node 822c of the first PFET-evaluate domino stage, and to provide its output to the gate of NFET 822e. Together, inverter 822f and NFET 822e form a half-keeper. In this configuration the half-keeper acts to hold output node 822c at a low level when the first PFET-evaluate domino stage has been reset.

A second domino logic stage 826 has an output node 827. Domino logic stage 826 is an n-stack domino stage and has the same circuit configuration as domino logic stage 600 shown and described in connection with FIG. 6(a). The gate of the reset device of domino logic stage 826 is coupled to output 825. Output 827 of domino stage 826 is coupled to an inverting logic gate 830. Inverting logic gate 830 has an output 831. In the illustrative example of FIG. 8, inverting logic gate 830 is a PFET-evaluate domino stage, identical in configuration to the first PFET-evaluate domino stage described above. Those skilled in the art will recognize that the circuit configuration of the PFET-evaluate domino stages may be different from those shown, and/or different from each other so as to accomplish different combinatorial logic functions.

A third domino logic stage 834 has an output node 835. Domino logic stage 834 is an n-stack domino stage and has the same circuit configuration as domino logic stage 600 shown and described in connection with FIG. 6(a). The gate of the reset device of domino logic stage 834 is coupled to output 833.

A pulse extender is used to provide increased hold time at the final output 841 of pipestage 800. In the illustrative embodiment shown in FIG. 8, the pulse extender is implemented with two inverters, two NFETs and a PFET. More particularly, output 835 of third domino stage 834 is coupled to: the gate of a PFET 840, the gate of an NFET 842, and the input of an inverter 836. PFET 840 is coupled between a power supply and output 841. NFET 842 is coupled between output 841 and an intermediate node 843. An NFET 844 is coupled between intermediate node 843 and ground. An inverter 838 is coupled in series between the output of inverter 836 and the gate of NFET 844.

In this illustrative embodiment of the present invention, circuit pairs are formed wherein an NFET evaluate path domino stage is coupled to a PFET-evaluate path domino stage. Similarly, such circuit pairs may also be formed wherein an NFET evaluate path domino stage is coupled to an inverting logic gate.

Further, in this illustrative embodiment of the present invention, the PFET-evaluate path domino stages have two parallel PFETs configured so as to implement the logical NAND function (i.e., either input going low makes the output go high). Those skilled in the art will understand that the a PFET-evaluate path domino stages may be configured to implement other combinatorial logic functions. Those skilled in the art will also understand that the NFET evaluate stacks shown in the illustrative example of FIG. 8 may be configured to implement combinatorial logic functions other than those shown.

The circuit pairs described above in this section have all had an n-stack domino stage as the first element followed in series by an inverting logic gate or PFET-evaluate domino stage. It will be understood by those skilled in the art that a pipestage can also be constructed where a PFET-evaluate domino stage is the first element followed in series by an inverting logic gate or n-stack domino stage.

Circuit Operation

Figure 7C:
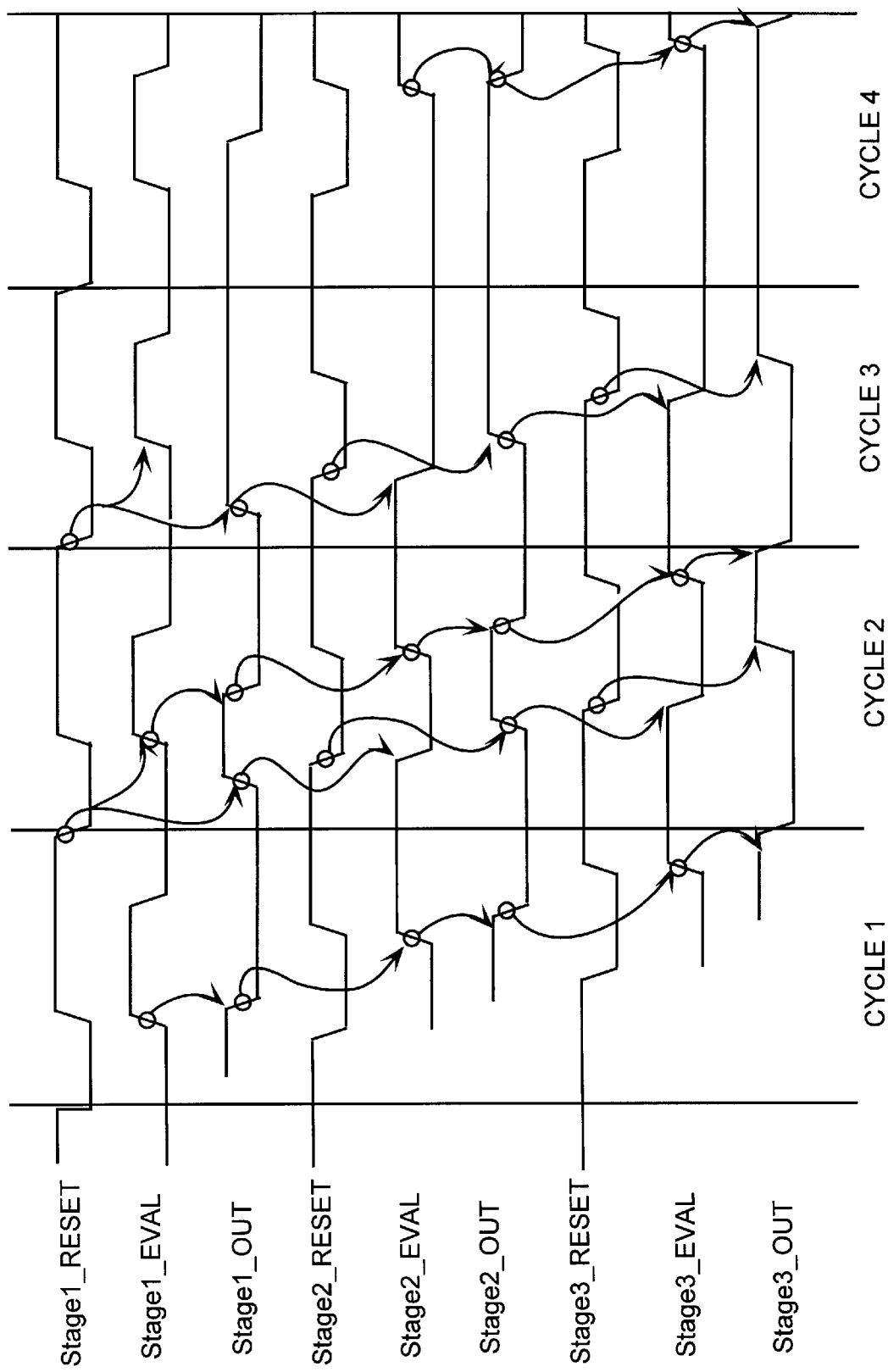
FIG. 7(c) is a timing diagram illustrating the timing relationship between various nodes in the circuit of FIG. 7(a).

The operation of an illustrative embodiment of the present invention is described with reference to FIGS. 7(a) and 7(c). In FIG. 7(c) the labels stage1$_{13}$EVAL, stage1$_{13}$RESET, stage1$_{13}$OUT, stage2$_{13}$EVAL, stage2$_{13}$RESET, stage2__OUT stage3__EVAL, stage3__RESET, and stage3__OUT correspond to nodes 703, 708, 714, 725, 721, 727, 723, 729, and 735 respectively. In this description, the pulse width of the initial pulse provided to pipestage 700, i.e., pulsed reset signal 703, is approximately equal to three delay units, and the various domino compatible logical inputs are assumed to be in the appropriate states for the domino chain to evaluate. In a single cycle of operation, a reset pulse temporally precedes an evaluate input in at least one domino stage of a domino logic circuit.

A low active pulse arrives at reset device 710 of the first domino stage and begins the process of resetting it by charging output node 714 to a high level. Charging output node 714 to a high level causes output 721 of inverting stage 720 to go low, thereby turning off, i.e., disabling, the evaluate path of second domino stage 726 substantially coincident in time with the arrival of the reset pulse (via output 725).

As the first domino stage resets, the leading edge of the reset pulse propagates through three inverting logic gates 702, 704, and 708 and begins the evaluate of the first domino stage by turning on NFET 712a, substantially coincident in time the deassertion of the reset signal at the gate of reset device 710. This causes transitions to propagate through the domino chain. At each stage, the reset process ends substantially coincident in time with the evaluate mode beginning.

The evaluate clock input to the first stage is pulsed, but from the first domino output on, all the evaluate pulse widths are frequency dependent. Several of the inverting logic gates into be atomically resetting circuit are selected to be atomically resetting in order to shorten pulse width races and keep pulses from degrading.

Conclusion

An advantage of the present invention is that only the reset path and the clock input to the first stage are pulsed. The longest functional race has a race loop of six inversions and that is the gap2 race between the disable of the reset device and the enable of the pulldown in the first stage. The longer gap2 races for the latter stages are only power races not functional races. Gap2 violations in the latter stages cause overlap current, and also cause evaluate propagation to be slowed down.

Other advantages of the present invention are that it can time borrow across circuit pipestages, which helps reduce the effects of clock jitter. The next pipestage input stage can be triggered by a late output rise. The circuit configuration of the present invention also provides five delay units of hold time. The main disadvantage of this scheme is that it requires the use of an early clock. This may require the addition of two inversions to the clock distribution.

It will be understood that various changes in the details, materials, and arrangements of the parts and steps which have been described and illustrated in order to explain the nature of this invention may be made by those skilled in the art without departing from the principles and scope of the invention as expressed in the subjoined claims.

What is claimed is:

1. A circuit comprising:

a circuit pair and at least one domino stage coupled to the circuit pair;

a first signal path having an output coupled to a reset input of the circuit pair; and a second signal path having an output coupled to an evaluate input of the circuit pair;

wherein the length of the second signal path is greater than the length of the first signal path by at least one inverting logic gate and wherein the first signal path comprises an atomically resetting inverting logic gate.

2. The circuit of claim 1, wherein the second signal path comprises an atomically resetting inverting logic gate.

3. The circuit of claim 1, wherein the output of second signal path is substantially an inversion of the output of the first signal path delayed by at least one delay unit.

4. The circuit of claim 1, wherein the circuit pair comprises an n-stack domino stage and an inverting logic gate coupled to the n-stack domino stage.

5. The circuit of claim 1, wherein the other domino stage comprises an n-stack domino stage.

6. The circuit of claim 1, wherein the circuit pair comprises an n-stack domino stage and a p-stack domino stage coupled to the n-stack domino stage.

7. A single phase domino logic circuit comprising:

at least one domino stage, each said domino stage having a reset pulse input and at least one evaluate input;

an evaluate signal generator having an evaluate signal output terminal, and operable to produce an evaluate signal at said evaluate signal output terminal, said evaluate signal output terminal coupled to at least one of said evaluate inputs of a first one of said domino stages; and a reset circuit having a reset pulse output terminal, and operable to produce a reset pulse at said reset pulse output terminal, said reset pulse output terminal coupled to said reset pulse input of said first one of said domino stages;

wherein said reset pulse has a leading edge which, in a single cycle temporally precedes the assertion of said evaluate signal and wherein said reset circuit comprises an atomically resetting inverting logic gate.

8. The single phase domino logic circuit of claim 7 wherein said atomically resetting inverting logic gate is an atomically resetting inverter.

9. The single phase domino logic circuit of claim 7, wherein said at least one domino stage has an NFET evaluate path.

10. The single phase domino logic circuit of claim 7, wherein said at least one domino stage has a PFET evaluate path.

* * * * *